United States Patent [19]

Zens

[11] Patent Number: 4,751,465
[45] Date of Patent: Jun. 14, 1988

[54] SPURIOUS RESONANCE CONTROL FOR NMR OBSERVE COILS

[75] Inventor: Albert P. Zens, Fremont, Calif.

[73] Assignee: Varian Associates, Inc., Palo Alto, Calif.

[21] Appl. No.: 44,382

[22] Filed: Apr. 30, 1987

[51] Int. Cl.⁴ ............................................. G01R 33/20
[52] U.S. Cl. ..................................... 324/322; 324/318
[58] Field of Search ............. 324/300, 307, 309, 318, 324/319, 320, 322, 61 P, 61 QS, 236; 336/184

[56] References Cited

U.S. PATENT DOCUMENTS

| | | | |
|---|---|---|---|
| 3,242,424 | 3/1966 | Redfield | 324/322 |
| 3,281,680 | 10/1966 | Faulkner | 324/322 |
| 3,529,234 | 9/1970 | Keen | 324/322 |
| 3,771,055 | 11/1973 | Anderson | 324/322 |
| 4,075,552 | 2/1978 | Traficante | 324/322 |
| 4,129,822 | 12/1978 | Traficante | 324/322 |
| 4,295,092 | 10/1981 | Okamura | 324/61 P |
| 4,450,408 | 5/1984 | Tiemann | 324/322 |
| 4,621,237 | 11/1986 | Timms | 324/322 |
| 4,633,181 | 12/1986 | Boesch et al. | 324/322 |
| 4,682,125 | 7/1987 | Harrison | 324/318 |

Primary Examiner—Michael J. Tokar
Attorney, Agent, or Firm—Stanley Z. Cole; Gerald M. Fisher; Edward H. Berkowitz

[57] ABSTRACT

The tuned LC circuit of an NMR probe includes a coil center tapped to ground through a capacitance selected to constrain parasitic resonances to a frequency region below decoupler frequencies employed in the probe.

3 Claims, 2 Drawing Sheets

SPURIOUS RESONANCE CONTROL FOR NMR OBSERVE COILS

FIELD OF THE INVENTION

The invention is in the general area of nuclear magnetic resonance instruments and methods and particularly relates to improvements for the RF properties of the observe coil of such apparatus.

BACKGROUND OF THE INVENTION

A broadband NMR instrument includes a receiver coil (observe coil) disposed to couple the RF signal emitted by the spin transitions in the sample to the preamplifier of the receiver subsystem. This coil is a tuned LC circuit with resonant properties adjusted by a capacitor network similar to the examples of balanced and unbalanced circuits of prior art indicated in FIGS. 1a and 1b. Idealized tuned circuits of this type produce a flat response over the designed range of broadband response with a single sharp absorption peak at the desired resonance frequency. Practical tuned circuits exhibit a more complex response due to distributed capacitance to ground for the coil. One result is the observation of another resonant peak at higher frequency. FIG. 2 shows the frequency response of a real circuit tuned for 100 MHz $C^{13}$ analysis. The parasitic higher frequency resonance is further complicated when the coil is loaded by insertion of the sample tube containing a sample. The dielectric properties of the sample and sample tube cause higher frequency resonance to occur at higher (or possibly lower) frequencies due to the dielectric properties of the sample.

In NMR instruments a second high frequency RF radiation is commonly employed to perturb (for example) proton-$C^{13}$ coupling. RF power for this purpose is supplied from a second RF source through an independent coil to perform the desired decoupling. The decoupler coil is disposed outside of the receiver coil in a typical system, that is, with the receiver coil between the decoupler coil and the sample.

The effect of a decoupler irradiation is attenuated at the sample by the shielding afforded by the receiver coil. When the receiver coil exhibits a resonance for the high frequency decoupler irradiation, that attenuation becomes quite substantial.

In the prior art, one way to minimize the attenuation due to the receiver coil consisted of constructed the decoupler coil from thin sheet conductor disposed very close to the receiver coil. The effective inductance of the receiver coil is then lowered in a manner similar to the effect of surrounding the receiver coil in a cylindrical conductor. The inductance of the coil decreases as the resonant frequency ($\omega = 1/LC$) increases. A sufficient shift of this resonance beyond the decoupler bandwidth mitigates some of the losses of decoupler radiation. This effect is purchased at the price of a significant lowering of the Q of the receive coil which is undesirable.

BRIEF DESCRIPTION OF THE INVENTION

In the present invention a discrete capacitance is added from the center of the receive coil to ground. The value of the capacitance is selected to limit the position of the high frequency resonance to a frequency above that of the decoupler radiation.

DETAILED DESCRIPTION OF THE INVENTION

Figure 3:
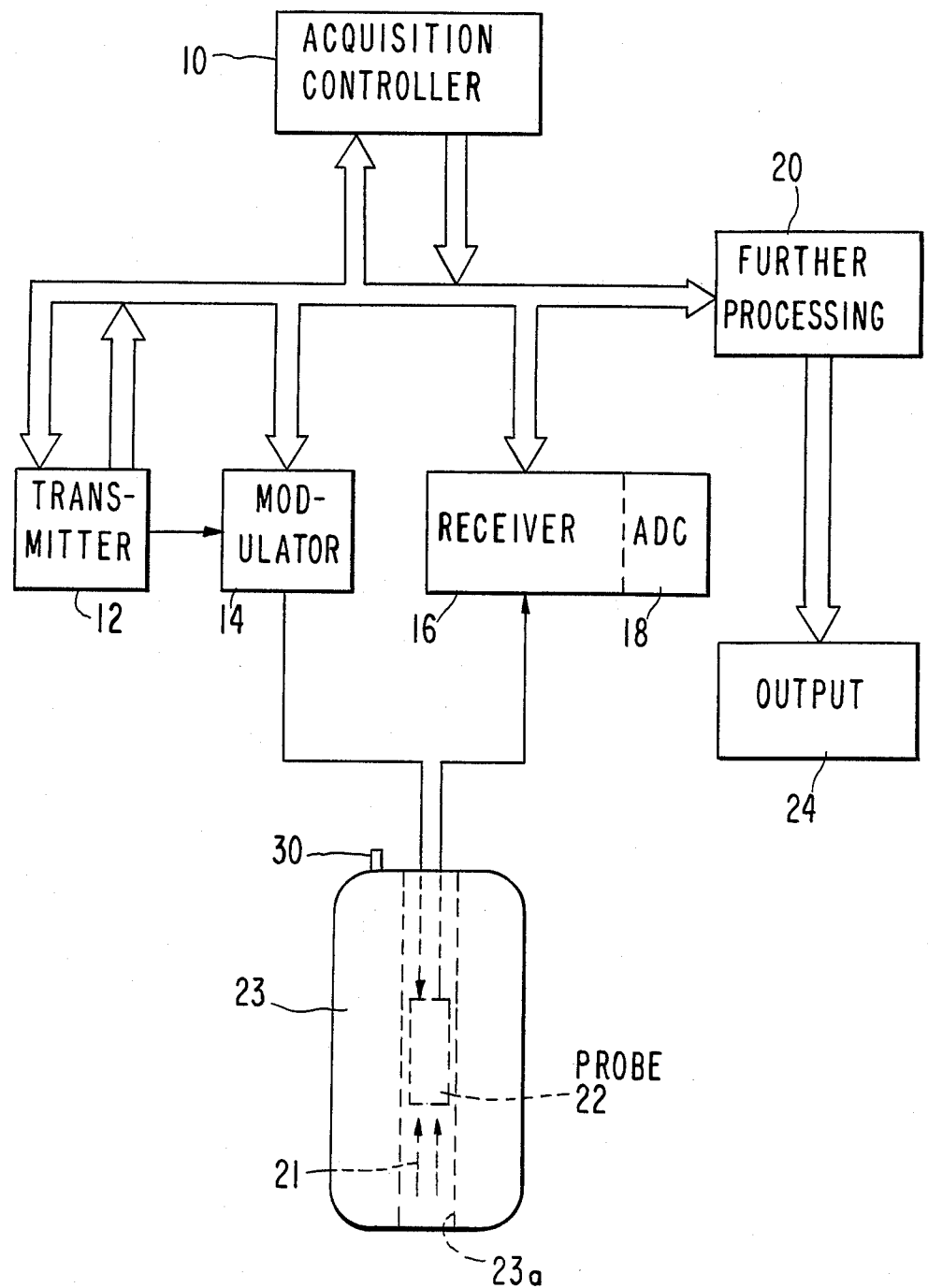
FIG. 3 is the operational context of the present invention.

Portions of a typical NMR data acquisition instrument are schematically illustrated on FIG. 3. An acquisition/control processor 10 communicates with an RF transmitter 12, modulator 14 and receiver 16, including analog-to-digital converter 18 and a further processor 20. The modulated RF power radiates an object (not shown) in a magnetic field 21 through a probe assembly 22 and the response to the object is intercepted by probe 22 communicating with receiver 16. The response typically takes the form of a transient oscillatory signal, often referred to as the time domain waveform. This transient waveform is sampled at regular intervals and samples are digitized in ADC 18. The digitized time domain waveform is then subject to further processing in processor 20. The nature of such processing may include averaging a time domain waveform with a number of similar such waveforms, and transformation of the average time domain waveform to the frequency domain yields a spectral distribution function directed to output device 24. The latter may take on any of the number of identities for the display of further analysis and data.

The magnetic field 21 which polarizes the sample is established by an appropriate means indicated in FIG. 1 in a cryostat 23 for maintaining a superconducting phase in a solenoid, not shown. The cryostat comprises a bore 23a in which the probe and sample are housed at room temperature.

Figure 4A:
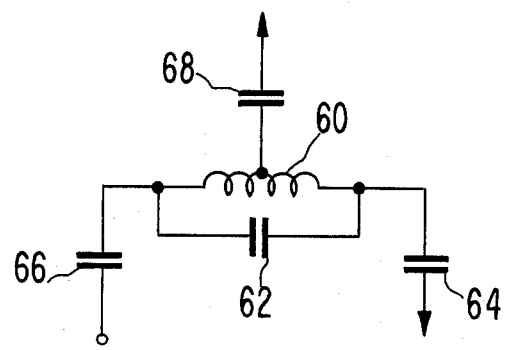
FIG. 4a illustrates the present invention for a balanced circuit.
Figure 4B:
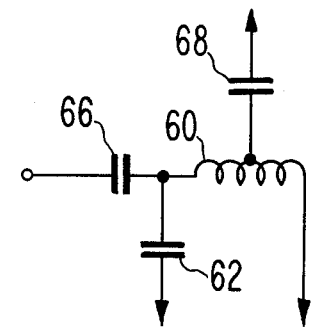
FIG. 4b illustrates the present invention for an unbalanced circuit.

Turning now to FIG. 4 there are shown examples of a probe assembly of the present invention which includes a receive coil 60 with a capacitance 62 forming a tuned parallel LC circuit. One side of coil 60 is connected to ground directly (FIG. 4b) or alternatively through capacitor 64 (FIG. 4a). The other side of the tuned LC combination is connected through capacitor 66 to a preamplifier not shown. The invention is effectuated through connection of a further capacitance 68 from the coil 60, approximately center-tapped, to the common potential or ground. The size of capacitor 68 is carefully selected to displace the parasitic resonance to a frequency region below any irradiation frequency employed in the measurement, such as decoupler radiation. In practice, this selection is accomplished with a sample tube in place and the decoupler frequency determined. The sample tube may be filled with a common solvent to further approximate realistic conditions, and if desired, a particular sample may be in place.

Typically, the value of the capacitance 68 is smaller than, or of the order of, the matching capacitance 62, while the capacitance 68 is larger than the distributed capacitance to ground.

In the balanced circuit of FIG. 4a, there is less constraint upon the magnitude of capacitor 68. The invention is also effectuated for the balanced circuit by a dc connection to ground from this point.

In FIG. 4b the constraint on capacitor 68 relates to the ratio of capacitance 62 to capacitance 68. In the case where capacitance 68 is smaller than capacitance 62, the circuit performs in a normal manner. When capacitance 68 is larger than capacitance 62, the circuit functions in less than optimal manner from signal to noise consideration.

Since many changes can be effected in the construction described above in many apparently widely differing embodiments of this invention could be constructed without departing from the scope thereof, it is intended that all matter contained in the above description and shown in the accompanying drawings shall be interpreted as illustrative and not in a limiting sense.

What is claimed is:

1. An NMR probe including a balanced parallel resonant LC circuit for detecting induced signals relative to a common potential, comprising:
   a coil and first capacitor forming said parallel tuned circuit;
   each junction of said coil and first capacitor connected respectively to second and third capacitors, said third capacitor in turn connected to said common potential, and said second capacitor adapted for connection to derive a signal therefrom;
   a fourth capacitance connected from substantially the center of said coil to said common potential whereby parasitic resonance may be constrained to a frequency below an upper limit frequency.

2. A probe including a parallel resonant LC circuit for detecting induced signals relative to a common potential comprising
   a coil and first capacitor each having two terminals forming said parallel tuned circuit,
   one junction comprising one terminal of said coil and first capacitor connected respectively to a second capacitor, the other terminal of said coil connected to said common potential, said first capacitor in turn connected to said common potential, and said second capacitor adapted for connection to derive a signal therefrom,
   a third capacitance connected from substantially the center of said coil to said common potential whereby parasitic resonance may be constrained to a frequency below an upper limit frequency.

3. A probe including a parallel resonant LC circuit for detecting induced signals relative to a common potential comprising
   a coil and first capacitor each having two terminals forming said parallel tuned circuit,
   one junction of one terminal of said coil and first capacitor connected respectively to a second capacitor, the other terminal of said coil connected to said common potential, said first capacitor in turn connected to said common potential, and said second capacitor adapted for connection to derive a signal therefrom,
   a dc conductive link connected from substantially the center of said coil to said common potential whereby parasitic resonance may be constrained to a frequency below an upper limit frequency.

* * * * *

UNITED STATES PATENT AND TRADEMARK OFFICE
CERTIFICATE OF CORRECTION

PATENT NO. : 4,751,465
DATED : June 14, 1988
INVENTOR(S) : Albert P. Zens

Figure 1A:
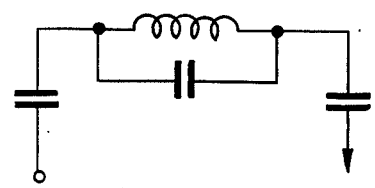
FIGS. 1a and 1b shows representative idealized coil circuits of prior art.
Figure 1B:
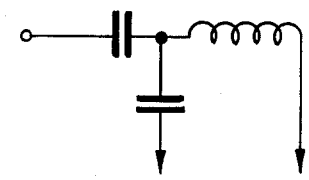
Figure 2:
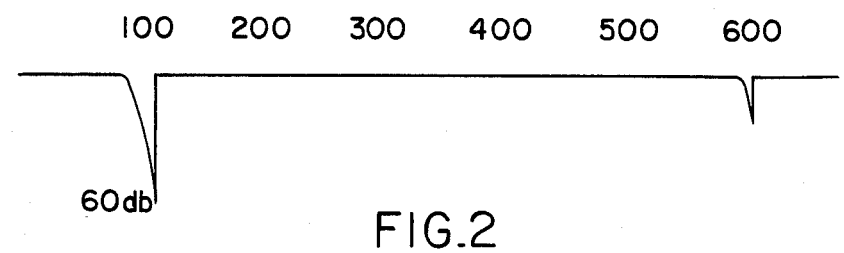
FIG. 2 shows the typical frequency response for coil circuits of FIG. 1.

It is certified that error appears in the above-identified patent and that said Letters Patent are hereby corrected as shown below:

Col. 2, line 6, delete "FIG. 1" and substitute --FIGS. 1a and 1b--.

Signed and Sealed this

Thirteenth Day of December, 1988

Attest:

DONALD J. QUIGG

*Attesting Officer*  *Commissioner of Patents and Trademarks*